United States Patent
Joshi et al.

(10) Patent No.: US 11,749,632 B2
(45) Date of Patent: Sep. 5, 2023

(54) GLASS-BASED BONDING STRUCTURES FOR POWER ELECTRONICS

(71) Applicant: Toyota Motor Engineering & Manufacturing North America, Inc., Plano, TX (US)

(72) Inventors: Shailesh N. Joshi, Ann Arbor, MI (US); Hiroshi Ukegawa, South Lyon, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 98 days.

(21) Appl. No.: 17/219,133

(22) Filed: Mar. 31, 2021

(65) Prior Publication Data

US 2022/0320031 A1 Oct. 6, 2022

(51) Int. Cl.
*H01L 23/367* (2006.01)
*H01L 23/00* (2006.01)

(52) U.S. Cl.
CPC .......... *H01L 24/32* (2013.01); *H01L 23/3677* (2013.01); *H01L 2224/27462* (2013.01); *H01L 2224/29188* (2013.01)

(58) Field of Classification Search
CPC ........................... H01L 24/32; H01L 23/3677
See application file for complete search history.

(56) References Cited

U.S. PATENT DOCUMENTS

| | | | |
|---|---|---|---|
| 5,277,724 A | 1/1994 | Prabhu | |
| 10,714,462 B2 * | 7/2020 | Bhagavat | H01L 23/49827 |
| 2009/0032970 A1 | 2/2009 | Park et al. | |
| 2010/0066970 A1 * | 3/2010 | Miyazaki | H01L 29/78603 349/158 |
| 2011/0114965 A1 | 5/2011 | Letertre | |
| 2019/0326273 A1 * | 10/2019 | Bhagavat | H01L 25/50 |

FOREIGN PATENT DOCUMENTS

| | | |
|---|---|---|
| JP | H02100347 A | 4/1990 |
| JP | 2013202648 A | 10/2013 |
| WO | 2017217149 A1 | 12/2017 |

* cited by examiner

*Primary Examiner* — Dale E Page
*Assistant Examiner* — Wilner Jean Baptiste
(74) *Attorney, Agent, or Firm* — Dinsmore & Shohl LLP

(57) ABSTRACT

A power electronics module includes a glass layer with one or more vias extending through the glass layer and having an electrically and thermally conductive material disposed within the one or more vias, a power electronic device directly bonded to a first surface of the glass layer, and, a cooling structure thermally coupled to a second surface of the glass layer.

18 Claims, 3 Drawing Sheets

GLASS-BASED BONDING STRUCTURES FOR POWER ELECTRONICS

TECHNICAL FIELD

The present disclosure generally relates to power electronics modules and, more specifically, to power electronics modules implementing a glass-based bonding structure for bonding a power electronic device to a cooling structure.

BACKGROUND

Power electronic devices such as power insulated-gate bipolar transistors (IGBTs) are used in electric vehicle applications as switches to convert DC power to AC power to drive electric motors. These power electronic devices generate significant heat during operation. Moreover, new silicon carbide (SiC) power electronic devices can operate at 250 degrees C. or more. Thus, power electronic devices may be coupled to a cooling device to remove heat flux. Bonding the power electronic device requires an electrical isolation layer between the power electronic device and the cooling structure. Typically, a direct-bonded-copper substrate (DBC) having a ceramic layer is used to couple the power electronic device to the cooling layer. However, DBC layers add significant thickness to the module, and a coefficient of thermal expansion difference between the silicon (or SiC) of the power electronic device and the DBC causes thermally induced stresses that can lead to device failure.

SUMMARY

In one aspect, a power electronics module includes a glass layer with one or more vias extending through the glass layer and having an electrically and thermally conductive material disposed within the one or more vias, a power electronic device directly bonded to a first surface of the glass layer, and, a cooling structure thermally coupled to a second surface of the glass layer.

In another aspect, a power electronics module includes a glass layer with one or more vias extending through the glass layer and having a phase change material disposed within the one or more vias, a power electronic device directly bonded to a first surface of the glass layer, and a cooling structure thermally coupled to a second surface of the glass layer.

In yet another aspect, a power electronics module includes a first glass layer with one or more vias extending through the first glass layer and having at least one of a phase change material or an electrically and thermally conductive material disposed within the one or more vias, a second glass layer with one or more vias extending through the second glass layer, a power electronic device directly bonded to a first surface of the first glass layer and a first surface of the second glass layer, a first cooling structure thermally coupled to a second surface of the first glass layer, and a second cooling structure thermally coupled to a second surface of the second glass layer.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
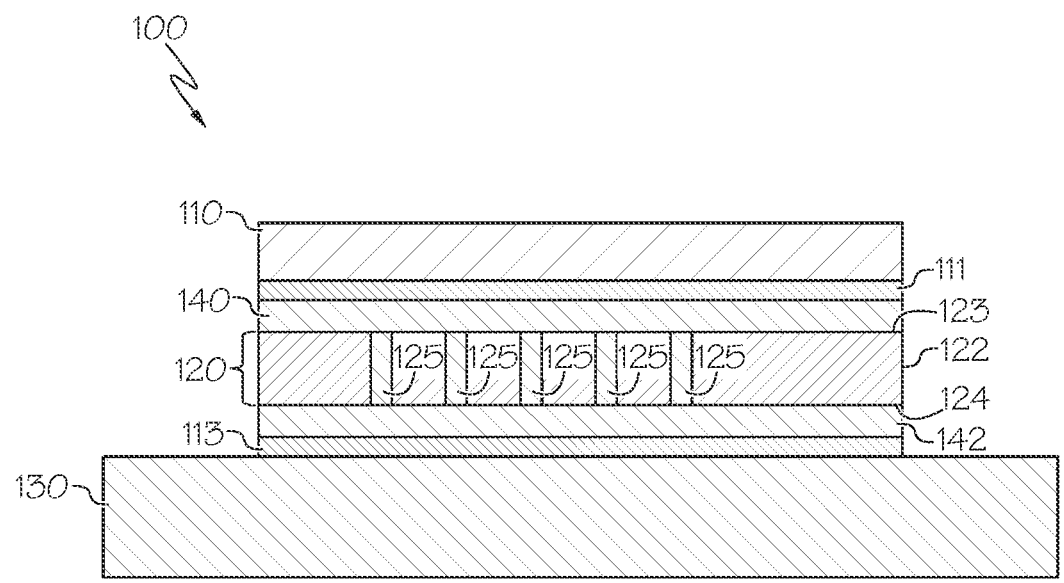
FIG. 1A depicts a cross-sectional side view of an illustrative example of a power electronics module having a power electronic device bonded to a cooling structure via a glass-based bonding structure and copper layers according to one or more embodiments shown and described herein.

Embodiments of the present disclosure relate to power electronics modules having glass-based bonding structures for power electronics to remove heat flux and reduce thermally induced stresses that can lead to device failure. That is, embodiments of the present disclosure provide reduced thermo-mechanical stress within the power electronics module as compared power modules that employ other means such as a softer core such as aluminum or employing a low coefficient of thermal expansion (CTE) substrate such as DBC substrate (e.g., having a 7.6 ppm/degree C. CTE) that can reduce the overall CTE of the device-substrate structure. However, aluminum has a high CTE (e.g., 23 ppm/degree C.) that can strain the bond layer resulting in failure or cracking of the softer core layer. Similarly, although DBC can reduce the overall CTE of the device-substrate structure, ceramic can crack over the life due to a high Young's modulus (modulus of elasticity, E), for example, of 150 GPa or greater. Additionally, implementing a glass layer instead of a ceramic layer is advantageous because glass has a lower cost and can be made to have a thickness of less than 100 microns, which is not possible with ceramics. Additionally, glass possesses equivalent dielectric strength to DBC. Furthermore, direct bonding of glass to the chip makes the overall structure stiffer such that chip deflection is reduce.

Embodiments of the disclosed structures include a low CTE bonding structure that has a CTE lower (e.g., about 10 or lower) than aluminum, traditional solder (e.g., having a CTE of about 23) and transient liquid phase (TLP) (e.g., having a CTE of about 14). The structure of embodiments disclosed herein consist of a flexible glass based bond line about 100 microns thick or less with vias that form thermal and/or electrical paths. The vias can provide both electrical and signal routing between the power electronic device and an electrode or substrate such as a printed circuit board (PCB). The glass has a CTE of 2 which is close to that of Si devices and SiC devices (e.g., the power electronic device) while copper has a CTE of 16. By using an appropriate combination of glass and vias filled with an electrically and thermally conductive material such as copper, aluminum, gold, tin, or the like, the overall CTE of the bond line can be tuned to be 10 or lower. The bond line of a material is used to describe where a material such as the glass-based bonding structure contacts components such as the power electronic device, an electrode, and/or cooling structure, when it is sandwiched in between them.

Furthermore, advantages of using glass over ceramic as disclosed in more detail herein include lower cost, thinner power electronics modules, equivalent dielectric strength and the reduction of chip deflection. More specifically, glass is low cost and can be made to be thinner than 100 microns which is not possible with ceramics. Additionally, the direct bonding of glass to the power electronic device makes the overall power electronics module stiffer which can reduce chip deflection and reduce the likelihood of the power electronic device cracking and failing as a result of thermal stress.

Various embodiments of power electronics modules implementing a glass-based bonding structure for bonding a power electronic device to a cooling structure will be described in greater detail below with reference to the Figures. Various embodiments of the power electronics modules are described herein that illustrate different configurations and implementations of the glass-based bonding structure as a component for bonding a power electronic device to a cooling structure.

Figure 1B:
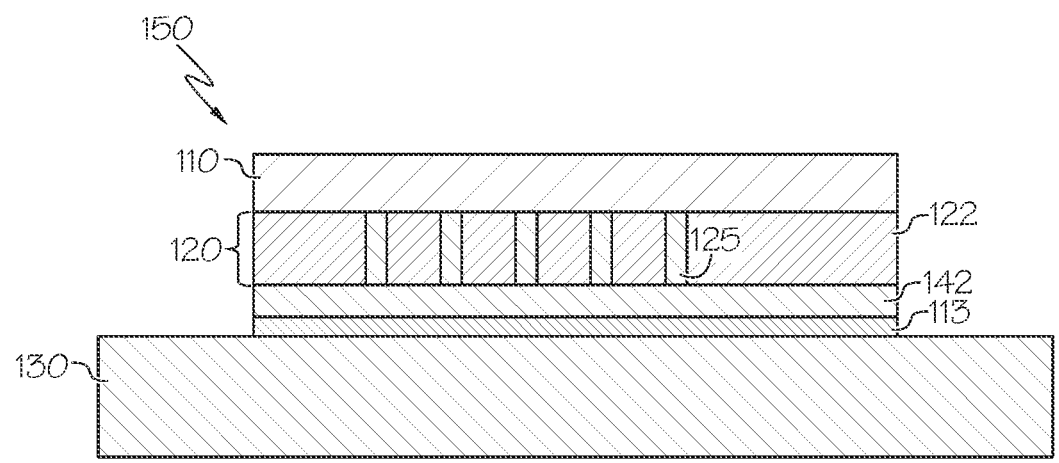
FIG. 1B depicts a cross-sectional side view of another illustrative example of a power electronics module having a power electronic device bonded to a cooling structure via a glass-based bonding structure and a copper layer according to one or more embodiments shown and described herein.

FIGS. 1A and 1B generally depict illustrative examples of power electronics modules 100 and 150 having a power electronic device 110 bonded to a cooling structure 130 via a glass-based bonding structure 120. The two power electronics modules depicted and describes with reference to FIGS. 1A and 1B include vias within the glass layer having a conductive, non-phase changing material such as a copper material disposed therein.

A power electronics modules 100 and 150 may be, for example, a power control unit (PCU) having any number of heat generating devices, cooling device(s), gate drivers, printed circuit boards (PCB), capacitors, etc. In embodiments, power electronics modules 100 and 150 as described herein may be used in vehicle applications for converting DC power to AC power to drive electric motors, though other uses are contemplated and possible. In the present embodiment, the power electronics modules 100 and 150 include a heat-generating device such as a power electronic device 110 that is thermally coupled to a cooling structure 130 via a glass-based bonding structure 120. The glass-based bonding structure 120 may thermally bond the heat-generating device such as the power electronic device 110 to the cooling structure 130.

The heat-generating device may include, for example, a power electronic device 110 such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the power electronic device 110 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the power electronic device 110 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power electronics module 100.

The cooling structure 130 may be any one of a variety of cooling devices. For example, the cooling structure 130 may be a heat sink, a cold plate, a liquid cooling device, a heat pipe, a vapor chamber, or the like. Heat sinks and cold plates may include plate fins forming microchannels configured to circulate fluid or air therebetween to extract heat from the heat-generating device coupled thereto. Similarly, a heat pipe may be a flat heat pipe. In general, a flat heat pipe includes an outer casing configured to define an enclosure having a void space therein. The inner surface of the outer casing may include porous media sintered to the inner wall and charged with a liquid. The porous media may be sinter metal particles such as copper, aluminum, gold, silver, or other thermally conductive material. The length of the flat heat pipe is defined by three portions, each having a different function. A first end receives heat from a thermally coupled heat source. The heat causes the liquid within the porous media to vaporize and flow within the void space, through a middle portion, to a second end, which may also be referred to as a condenser length. As the vapor moves away from the source of heat, the vapor may begin to condense. The vapor may condense at the second end and be transferred back in to the porous media. The porous media may act as a conduit that allows the liquid to return to the first end through the middle portion. The vapor-liquid-vapor cycle within the flat heat pipe promotes heat transfer from the source of heat received at a first end to be expelled at the second end. Vapor chambers, while structured in a different manner as compared to the flat heat pipe, operate in a similar manner where heat is transferred through the vaporization of a cooling fluid within a sealed chamber that condenses and returns to the source of heat.

Still referring to FIGS. 1A and 1B, the glass-based bonding structure 120 includes a glass layer 122 having one or more vias 125 extending through the glass layer 122. That is, the one or more vias 125 extend from a first surface 123 of the glass layer 122 of the glass-based bonding structure 120 to a second surface 124 of the glass layer 122 of the glass-based bonding structure 120. The one or more vias 125 refer to small openings in the glass layer 122 that may be filled with a material such as a metal, alloy or the like, or a phase change material such that the CTE of the glass-based bonding structure 120 is tunable.

As used herein "glass layer" refers to a layer of flexible glass material that is characterized by its thickness, Young's modulus, and CTE. That is, the glass layer 122 is a flexible glass material having a thickness of 100 microns or less. For example, the glass layer 122 may be about 100 microns, 90 microns, 80 microns 70 microns, 60 microns, 50 microns, 40 microns, or any value therebetween and/or including 100 microns and 40 microns. It should be understood that the glass layer 122 is further defined by its Young's modulus which is about 70 GPa or less. For example, the Young's modulus of the glass layer 122 may be about 70 GPa, 65 GPa, 60 GPa, 55 GPa, 50 GPa, 45 GPa, 40 GPa, 35 GPa, 30 GPa or less, or any value therebetween and/or including 70 GPa and 30 GPa. It should further be understood that the glass layer 122 is a flexible glass material that is capable of withstanding high temperatures such as 250 degree C. or more without structurally failing (e.g., cracking, melting, or permanently deforming). That is, for example, FR-4 and similar materials which may include glass but are unable to achieve the disclosed temperature, thickness and Young's modulus parameters.

The glass-based bonding structure 120 including the glass layer 122 and the one or more vias has a combined CTE of 10 or less, optionally, 5 or less. More specifically, it should be understood that the CTE of the glass-based bonding structure 120 is tunable. By having a glass-based bonding structure 120 that has a CTE that is similar to that of the material of the power electronic device 110, thermal stress between the components may be reduced. One way to achieve a similar CTE is by tuning the glass-based bonding structure 120. Tuning of the CTE of the glass-based bonding structure 120 is achieved by selecting an appropriate size for each via 125, the number of vias 125 within the glass layer 122, and the density of vias 125 within the glass layer 122. Moreover, the CTE of the glass-based bonding structure 120 may be further tuned through the selection of the material that fills the vias 125. For example, the one or more vias 125 within the glass layer 122 may include a thermally and electrically conductive material such as gold, copper, aluminum, tin, silver, or the like. In some embodiments, as described in more detail herein, may include a phase change material that melts when the power electronic device 110 exceeds a predetermined temperature thereby causing the thermal stress of the power electronics module to be reduced. The one or more vias 125 may operate to electrically couple the power electronic device 110 to an electrode 142, for example, and/or provide low thermal resistance paths to facilitate the transfer of heat away from the power electronic device 110. Accordingly, the size and number of vias 125 within the glass layer 122 is a function of the power density and the amount of current that may be passed through the vias 125 when implemented as an electrical connection between the power electronic device 110 and an electrode 142 or other electrical component.

As depicted in FIG. 1A, the power electronics module 100 is shown to have a plurality of layers. The power electronic device 110 is thermally and/or electrically bonded to a first electrode 140, optionally via a bonding material 111. The first electrode 140 may be an electrically conductive electrode such as a copper layer. Additionally, although a bonding material 111 is depicted the power electronic device 110 may be directly bonded to the first electrode 140. The first electrode 140 is further bonded to the glass-based bonding structure 120 on a first surface 123. The second surface 124, opposite the first surface 123 of the glass-based bonding structure 120 is bonded to a second electrode 142. In some embodiments, the first and second electrodes 140 and 142 may be layers of material that are electroplated onto the glass layer 122 of the glass-based bonding structure 120. For example, a copper layer may be electroplated onto the glass layer 122 of the glass-based bonding structure 120 to form the first and second electrodes 140 and 142. The thickness of each the first and second electrodes 140 and 142 is between about 30 micron and about 50 micron.

The second electrode 142 is thermally coupled to a cooling structure 130, optionally with a bonding material 113. The bonding material 111 and 113 may be a solder, thermal adhesive, thermal grease, thermal epoxy, or the like. However, it is understood that the bonding materials 111 and/or 113 are not a necessary component in the implementation of the power electronics modules depicted and described herein.

As described herein, the cooling structure 130 is configured to facilitate the transfer of heat that is generated by the power electronic device 110 away from and/or out of the power electronics module 100. The cooling structure 130 may be a bulk material in the form of a cold plate or heat sink having plate fins or pin fins. In some embodiments, the cooling structure 130 may be a liquid cooling device such as a cooling manifold that actively flows cooling fluid through the cooling structure 130 to remove heat. The cooling structure 130 may further be coupled to a cooling system having a condenser, fluid pump, heat exchanger, or the like (not shown).

The fewer intermediate layers and the thinner the layers between the source of the heat (e.g., the power electronic device 110) and the cooling structure 130 are, the more efficient the heat transfer can be. Accordingly, in some embodiments, the power electronic device 110 may be more directly coupled to the cooling structure 130 as depicted in FIG. 1B. FIG. 1B depicts a cross-sectional view of another illustrative example of a power electronics module 150 having a power electronic device 110 bonded to a cooling structure 130 via a glass-based bonding structure 120 and an electrode 142. In some embodiments, the power electronic device 110 is directly coupled to the glass-based bonding structure 120. The direct bonding removes the need for the first electrode 140 and the bonding material 111 shown in FIG. 1A. When direct bonding techniques are implemented to couple the power electronic device 110 directly to the glass-based bonding structure 120, CTE matching between material of the power electronic device 110 and the glass-based bonding structure 120 is more imperative since there is no intermediate layer to account for CTE mismatch.

The glass-based bonding structure 120 is further bonded to a second electrode 142. The second electrode 142 is thermally coupled to a cooling structure 130, optionally with a bonding material 113. The bonding material 111 and 113 may be a solder, thermal adhesive, thermal grease, thermal epoxy, or the like. However, it is understood that the bonding materials 111 and/or 113 are not a necessary component in the implementation of the power electronics modules depicted and described herein.

Figure 2A:
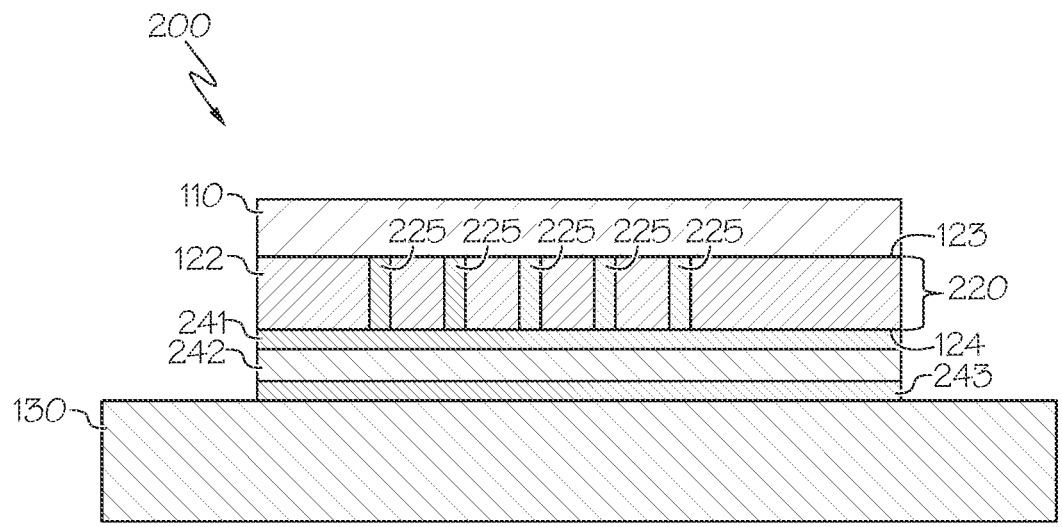
FIG. 2A depicts a cross-sectional side view of another illustrative example of a power electronics module having a power electronic device bonded to a cooling structure via a glass-based bonding structure and a phase change material according to one or more embodiments shown and described herein.
Figure 2B:
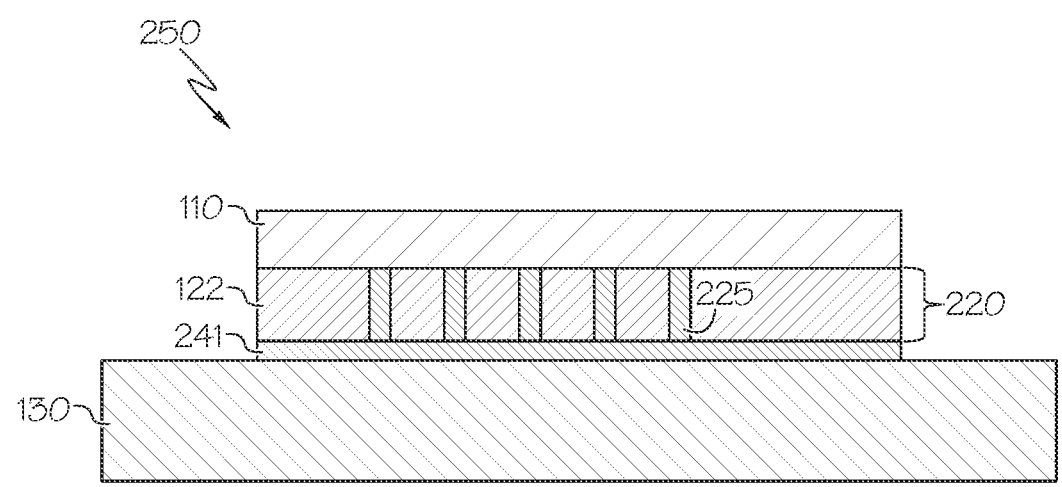
FIG. 2B depicts a cross-sectional side view of an illustrative example of a power electronics module having a power electronic device bonded to a cooling structure directly via a glass-based bonding structure according to one or more embodiments shown and described herein.

In some embodiments, the power electronics modules 200 and 250, for example, as shown in FIGS. 2A and 2B, may include a phase change material. A phase change material is one which will store or release energy when it changes phase, such as, for example, from solid to liquid or liquid to solid. Nearly all soft solders classify as phase change materials according to their melting temperature. The melting temperature of a typical phase change material is between 0 degree C. and 250 degree C. Phase change materials are typically applied as a solid since at room temperature they are firm and available with specific dimensions. However, melting and applying them through a process such as reflow is possible. Furthermore phase change materials each change phase at a unique temperature. Therefore, it is possible to match an appropriate phase change material an application so that it will reach the phase change temperature within the normal operating cycle of the device. It is further possible to configure the phase change material to be malleable at a predetermined operating temperature of the power electronic device 110 so that the phase change material may reduce thermal stress within the glass layer 122 when disposed within the one or more vias 225 therein.

As depicted in FIGS. 2A and 2B, the power electronic device 110 is directly bonded to a first surface 123 of the glass-based bonding structure 220. The glass-based bonding structure 220 includes a glass layer 122 having one or more vias 225 extending through the glass layer 122 from the first surface 123 to the second surface 124. The one or more vias 225 include a phase change material such as tin, indium, or the like. When the device operates at a high temperature, the phase change material melts, which further reduces the thermal stress on the module and also provides for additional heat flux removal.

Referring specifically to FIG. 2A, the glass-based bonding structure 220 is electrically and thermally coupled to a first side of an electrode 242 via an optional bonding material 241. The electrode 242 operates as an electrical path for control signals and/or power signals to and from the power electronic device 110. The second side of the electrode 242 is coupled to the cooling structure 130, optionally via a bonding material 243. However, FIG. 2B depicts an embodiment where the glass-based bonding structure 220, having phase change material disposed within the one or more vias 225, is directly bonded to the cooling structure 130. Direct bonding of the glass-based bonding structure 220 to the cooling structure 130 may increase heat flux transfer from the power electronic device 110 to the cooling structure 130, but may not be practical if the power electronic device 110 includes electrical connections on the surface coupled to the glass-based bonding structure 220. That is, electrode 242 that is present in the power electronics module 200 depicted in FIG. 2A, is not present in the power electronics module 250 depicted in FIG. 2B. Accordingly, the choice of implementing power electronics module 200 as opposed to power electronics module 250 depends on the electrical connection configuration of the power electronic device 110. For example, some power electronic devices 110 may include all the electrical connections on a single surface, whereas others may utilize opposing surfaces to provide all the power and signal electrical connections to and from the power electronic device 110.

Figure 3A:
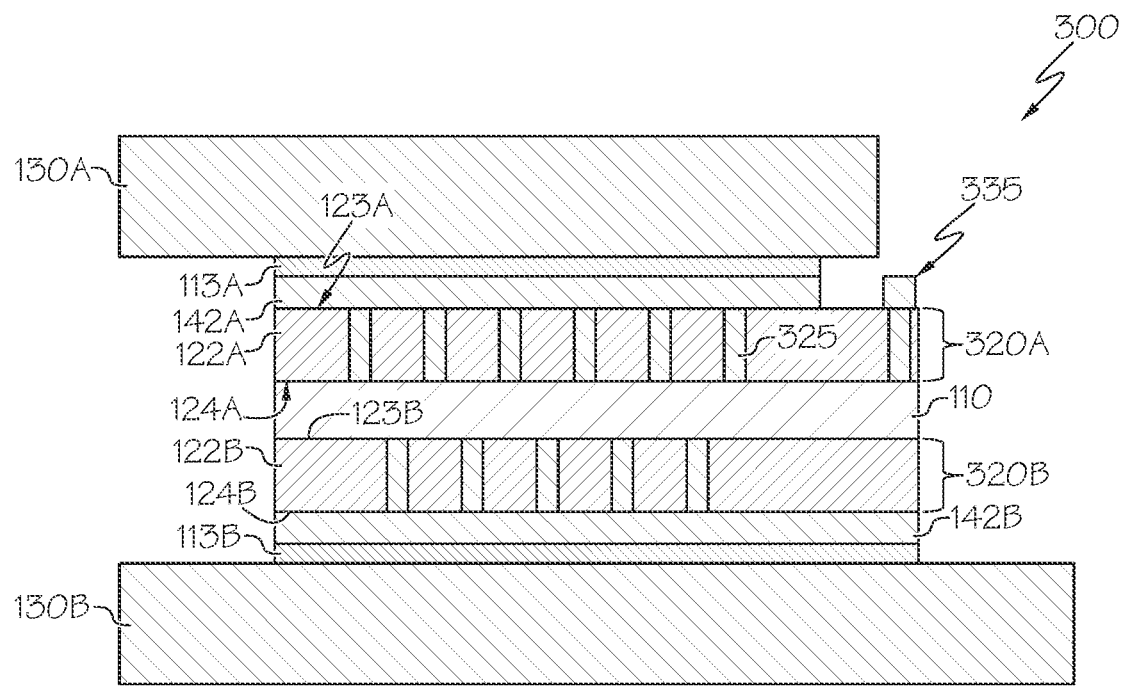
FIG. 3A depicts a cross-sectional side view of an illustrative example of a double sided power electronics module having a power electronic device bonded to cooling structures on opposite sides of the power electronic device via glass-based bonding structures and copper layers according to one or more embodiments shown and described herein.
Figure 3B:
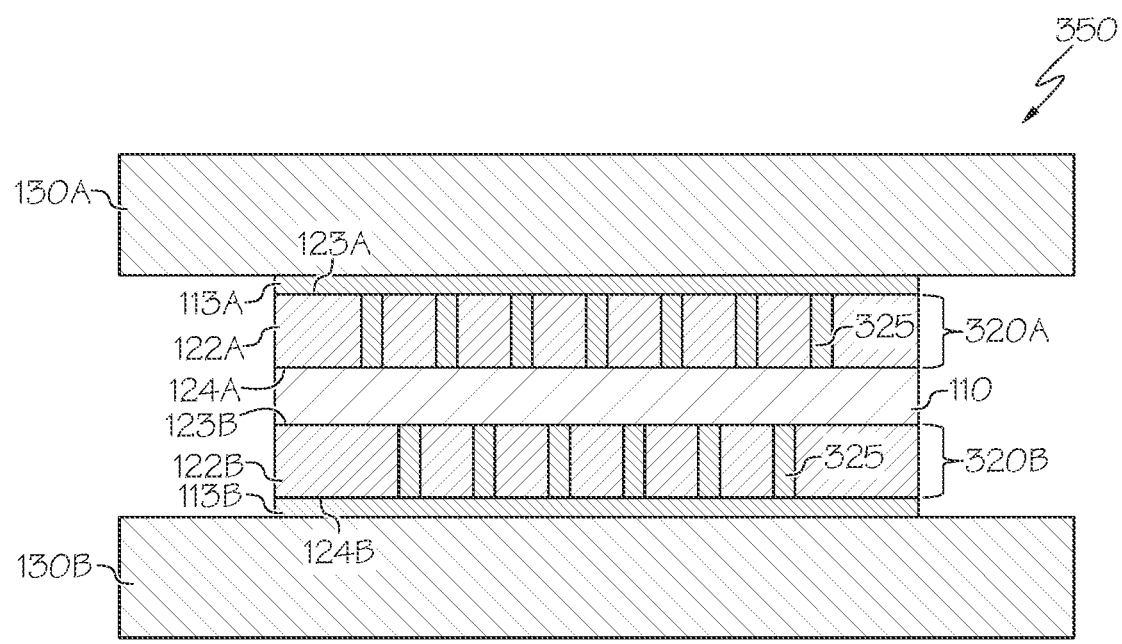
FIG. 3B depicts a cross-sectional side view of another illustrative example of a double sided power electronics module having a power electronic device bonded to cooling structures on opposite sides of the power electronic device via glass-based bonding structures and phase change material according to one or more embodiments shown and described herein.

Referring now to FIGS. 3A and 3B, a cross-sectional views of illustrative examples of double-sided power electronics modules 300 and 350 having a power electronic device 110 bonded to cooling structures 130A and 130B on opposite sides of the power electronic device 110 via glass-based bonding structures 320A and 320B are depicted. FIG. 3A depicts an embodiment of a power electronics module 300 having a power electronic device 110 that is directly bonded to a first glass-based bonding structure 320A on a top side and a second glass-based bonding structure 320B on a bottom side of the power electronic device 110. That is, the second surface 124A of the glass layer 122A of the first glass-based bonding structure 320A is directly bonded to the top side of the power electronic device 110. The first surface 123B of the glass layer 122B of the second glass-based bonding structure 320B is directly bonded to the bottom side of the power electronic device 110.

Furthermore, the first surface 123A of the glass layer 122A of the first glass-based bonding structure 320A is electrically and thermally coupled to a first electrode 142A. The first electrode 142A is further coupled to the first cooling structure 130A optionally with a bonding material 113A. The second surface 124B of the glass layer 122B of the second glass-based bonding structure 320B is electrically and thermally coupled to a second electrode 142B. The second electrode 142B is further coupled to the second cooling structure 130B optionally with a bonding material 113B. The power electronics module 300 further depicts a tertiary electrical connector 335 that is electrically coupled to the power electronic device 110 through one or more vias 325 extending through the first glass-based bonding structure 320A. The tertiary electrical connector 335 may be configured as a power signal or control signal electrical conduit to and from the power electronic device 110, which thereby provides at least three (e.g., the first electrode 142A, the second electrode 142B, and the tertiary electrical connector 335) electrical connections to and from the power electronic device 110.

Turning to FIG. 3B, an embodiment of a power electronics module 350 having a power electronic device 110 that is directly bonded to a first glass-based bonding structure 320A on a top side and a second glass-based bonding structure 320B on a bottom side of the power electronic device 110 is depicted. That is, the second surface 124A of the glass layer 122A of the first glass-based bonding structure 320A is directly bonded to the top side of the power electronic device 110. The first surface 123B of the glass layer 122B of the second glass-based bonding structure 320B is directly bonded to the bottom side of the power electronic device 110.

Furthermore, the first surface 123A of the glass layer 122A of the first glass-based bonding structure 320A is directly coupled to the first cooling structure 130A optionally with a bonding material 113A. The second surface 124B of the glass layer 122B of the second glass-based bonding structure 320B is directly coupled to the second cooling structure 130B optionally with a bonding material 113B. As described herein, by reducing the number of intermediate layers between the power electronic device 110 and the cooling structures 130A and 130B the transfer of heat generated by the power electronic device 110 can be optimized. Furthermore, as described herein the one or more vias 325 may include a conductive material such as copper that will not phase change at high temperatures but facilitate thermal and electrical connections through the glass-based bonding structures 320A and 320B or a phase change material that may enhance thermal conductivity through the glass-based bonding structures 320A and 320B.

It should be understood that each of the power modules depicted and described herein may be implemented as a component of a power electronics system such as an inverter, convertor, or other power device, for example, for an electric vehicle drive system or the like. Additionally, it should now be understood that the power electronics modules described herein generally include a glass-based bond structure comprising a glass layer with one or more vias extending through the glass layer and having an electrically and thermally conductive material disposed within the one or more vias, a power electronic device directly bonded to a first surface of the glass-based bond structure, and a cooling structure thermally coupled to a second surface of the glass-based bond structure. The glass layer is a flexible glass material having a thickness of about 100 microns or less and a modulus of elasticity of 70 GPa or less. The CTE of the glass-based bond structure may be 10 or less and further may be tuned to match the material of the power electronic device included in the power electronics module.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics module, comprising:
   a glass layer with one or more vias extending through the glass layer and having an electrically and thermally conductive material disposed within the one or more vias;
   a power electronic device directly bonded to a first surface of the glass layer;
   a cooling structure thermally coupled to a second surface of the glass layer; and
   an electrode layer disposed between the second surface of the glass layer and the cooling structure, wherein the electrode layer is electroplated to the glass layer.

2. The power electronics module of claim 1, wherein a thickness of the electrode layer is between about 30 microns and about 50 microns.

3. The power electronics module of claim 1, wherein a thickness of the glass layer is about 100 microns or less.

4. The power electronics module of claim 1, wherein the glass layer is a flexible glass having a modulus of elasticity of 70 GPa or less.

5. The power electronics module of claim 1, wherein a coefficient of thermal expansion (CTE) of the glass layer with the one or more vias is 10 or less.

6. The power electronics module of claim 5, wherein the CTE is 5 or less.

7. The power electronics module of claim 1, wherein the cooling structure is bonded directly to the second surface of the glass layer.

8. The power electronics module of claim 1, wherein the power electronic device is a Si or SiC power electronic device.

9. The power electronics module of claim 1, wherein the cooling structure is at least one of a heat sink, a heat pipe, a vapor chamber, or a cold plate.

10. A power electronics module, comprising:
    a glass layer with one or more vias extending through the glass layer and having a phase change material disposed within the one or more vias;
    a power electronic device directly bonded to a first surface of the glass layer;
    a cooling structure thermally coupled to a second surface of the glass layer; and
    an electrode layer disposed between the second surface of the glass layer and the cooling structure, wherein the electrode layer is electroplated to the glass layer.

11. The power electronics module of claim 10, wherein a thickness of the electrode layer is between about 30 microns and about 50 microns.

12. The power electronics module of claim 10, wherein a thickness of the glass layer is about 100 microns or less.

13. The power electronics module of claim 10, wherein the glass layer is a flexible glass having a modulus of elasticity of 70 GPa or less.

14. The power electronics module of claim 10, wherein a CTE of the glass layer with the one or more vias is 10 or less.

15. The power electronics module of claim 10, wherein the phase change material is tin or indium.

16. The power electronics module of claim 10, wherein the phase change material melts when the power electronic device exceeds a predetermined temperature such that a thermal stress of the power electronics module is reduced.

17. The power electronics module of claim 10, wherein the power electronic device is a Si or SiC power electronic device.

18. A power electronics module, comprising:
    a first glass layer with one or more vias extending through the first glass layer and having at least one of a phase change material or an electrically and thermally conductive material disposed within the one or more vias;
    a second glass layer with one or more vias extending through the second glass layer;
    a power electronic device directly bonded to a first surface of the first glass layer and a first surface of the second glass layer;
    a first cooling structure thermally coupled to a second surface of the first glass layer;
    a second cooling structure thermally coupled to a second surface of the second glass layer; and
    an electrode layer disposed between the second surface of the first glass layer and the first cooling structure, wherein the electrode layer is electroplated to the first glass layer.

* * * * *